United States Patent
Montgomery et al.

(10) Patent No.: US 10,522,787 B1
(45) Date of Patent: Dec. 31, 2019

(54) HIGH EFFICIENCY QUANTUM DOT LED STRUCTURE

(71) Applicant: Sharp Kabushiki Kaisha, Osaka (JP)

(72) Inventors: David James Montgomery, Oxford (GB); Edward Andrew Boardman, Oxford (GB); James Andrew Robert Palles-Dimmock, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/200,817

(22) Filed: Nov. 27, 2018

(51) Int. Cl.
| | | |
|---|---|---|
| *H01L 51/52* | (2006.01) | |
| *H01L 51/50* | (2006.01) | |
| *H01L 27/32* | (2006.01) | |
| *H01L 51/00* | (2006.01) | |

(52) U.S. Cl.
CPC ...... *H01L 51/5265* (2013.01); *H01L 27/3206* (2013.01); *H01L 51/502* (2013.01); *H01L 51/5064* (2013.01); *H01L 51/5072* (2013.01); *H01L 51/5218* (2013.01); *H01L 51/5234* (2013.01); *H01L 51/0035* (2013.01); *H01L 51/0037* (2013.01); *H01L 51/0039* (2013.01); *H01L 2251/5315* (2013.01); *H01L 2251/558* (2013.01)

(58) Field of Classification Search
CPC ............. H01L 51/5271; H01L 51/5234; H01L 51/5265; H01L 51/502; H01L 51/0039
See application file for complete search history.

(56) References Cited

U.S. PATENT DOCUMENTS

| | | | |
|---|---|---|---|
| 7,324,574 B2 | 1/2008 | Kim | |
| 8,471,268 B2 | 6/2013 | Moon et al. | |
| 8,581,230 B2 | 11/2013 | Kim et al. | |
| 8,894,243 B2 | 11/2014 | Cho et al. | |
| 9,525,148 B2 | 12/2016 | Kazlas et al. | |
| 9,583,727 B2 | 2/2017 | Cho et al. | |
| 2006/0158098 A1 | 7/2006 | Raychaudhuri et al. | |
| 2011/0163339 A1* | 7/2011 | Negishi ............... | H01L 51/5234 257/98 |
| 2014/0014896 A1* | 1/2014 | Chung .................... | H01L 33/14 257/13 |

(Continued)

FOREIGN PATENT DOCUMENTS

WO   WO 2017205174   11/2017

*Primary Examiner* — Changhyun Yi
(74) *Attorney, Agent, or Firm* — Renner, Otto, Boisselle & Sklar, LLP

(57) ABSTRACT

A light-emitting device maximizes optical efficiency when the emissive layer is high refractive index material. Said device includes an emissive layer; a first electrode and a second electrode from which charges are generated; a first charge transport layer that injects charges from the first electrode into the emissive layer; and a second charge transport layer that injects charges from the second electrode into the emissive layer. A Fresnel reflection value at boundaries between the emissive layer and at least one of the first and second charge transport layers is from 5% through 30%, and at least one of the charge transport layers satisfies a half wavelength condition of having a thickness that is equal to within twenty percent of ½ of one wavelength of an integer multiple of ½ of one wavelength in the charge transport layer material within a bandwidth of emission of the emissive layer.

20 Claims, 8 Drawing Sheets

(56) References Cited

U.S. PATENT DOCUMENTS

| | | |
|---|---|---|
| 2015/0084012 A1 | 3/2015 | Kim et al. |
| 2015/0188078 A1* | 7/2015 | Osawa ............... H01L 51/5234 257/40 |
| 2015/0340410 A1 | 11/2015 | Hack et al. |
| 2017/0207281 A1 | 7/2017 | Hack et al. |
| 2019/0280153 A1* | 9/2019 | Coe-Sullivan ........ H01L 51/502 |

* cited by examiner

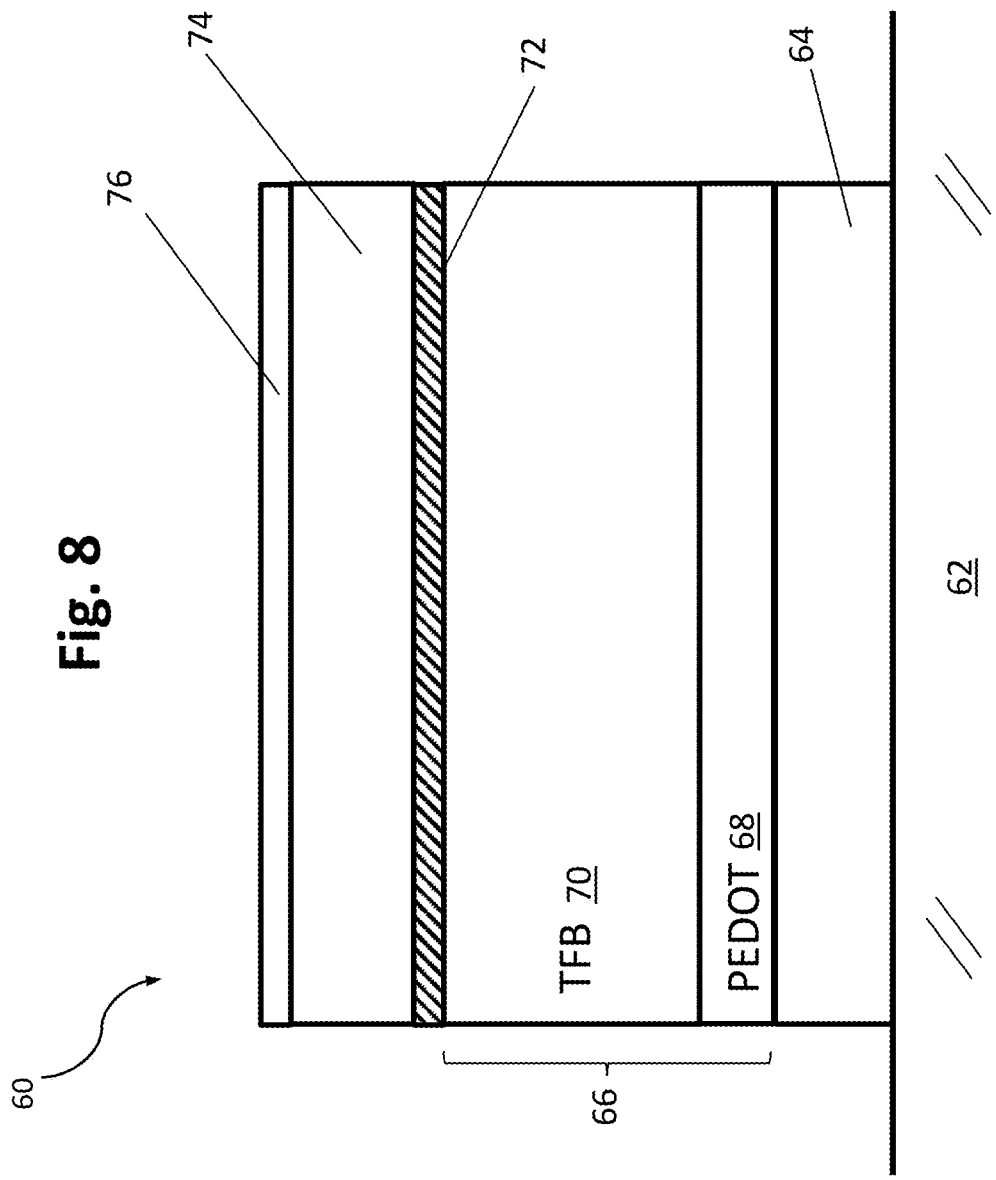

HIGH EFFICIENCY QUANTUM DOT LED STRUCTURE

TECHNICAL FIELD

This invention relates to a layer structure used for an emissive device, such as a quantum dot light-emitting device (QLED) that may be incorporated into a display. In particular, this invention relates to enhancing optical efficiency and improving brightness for top emitting structures in which the emission layer has a high refractive index, for example indium phosphide (InP) emissive layers of quantum dots.

BACKGROUND ART

An example of a conventional light-emitting device is described in U.S. Pat. No. 9,525,148 (Kazlas et al., issued Dec. 20, 2016). FIG. 1 is a drawing depicting an exemplary representation of such a conventional light-emitting device. A conventional light-emitting device includes an anode 104 and cathode 100, and a light-emitting or emissive layer 102 containing a material that emits light 107. Within the light-emitting layer 102, light is produced upon electron and hole recombination to generate the light 107. The light-emitting layer 102 may be an inorganic or organic semiconductor layer, or a layer of quantum dots (QDs). At least one hole transport layer 103 is located between the anode 104 and the emissive layer 102, which provides transport of holes from the anode and injection of holes into the emissive layer. Similarly, at least one electron transport layer 101 is located between the cathode 100 and emissive layer 102, which provides transport of electrons from the cathode and injection of electrons into the emissive layer. As is referred to in the art, a "top emitting light-emitting device" is a device in which the light emission is from the side opposite from a glass layer substrate upon which the other layers are deposited.

In such conventional structures, the layer (or layers) 101 between the cathode 100 and emissive layer 102 is termed the electron transport layer (ETL), and the layer (or layers) 103 between the anode 104 and the emissive layer 102 is termed the hole transport layer (HTL). The ETL and HTL are collectively referred to more generally as charge transport layers (CTL). The purpose of these CTLs is to provide an ohmic contact to the respective electrode (anode or cathode), and to provide energetic alignment for injecting carriers (electrons or holes) into the emissive layer. In conventional structures, the ETL is often comprised of a matrix of nanoparticles 108, which provides electron transport through hopping 109 between adjacent nanoparticles and into the emission layer 102. Similarly, the HTL is often comprised of a matrix of nanoparticles 110 (which typically are different from the ETL nanoparticles 109), which provides electron transport through hopping 111 between adjacent nanoparticles and into the emissive layer 102. As referenced above, the electrons and holes recombine within the emissive layer 102 to generate the light 107. In a conventional system only the ETL are nanoparticles, as TFB and PEDOT:PSS layers typically are not nanoparticle layers but continuous layers. The emissive layer is a QD layer, which is shown in FIG. 1 as the spheres. Nanoparticle materials also may be used for the HTL layer.

Because the electrodes (anode and cathode) are at least partially reflecting, an optical cavity is formed between the electrodes. Such cavities are well known in the art of semiconductor laser fabrication, as described for example in U.S. Pat. No. 7,324,574 (Kim, issued Jan. 29, 2008), although their use with organic LEDs is more recent. There are a number of descriptions for organic light-emitting diode (OLED) and QLED applications that describe cavities in the LED structure and the effect on light emission. For example, US 2006/0158098 (Raychaudhuri et al., published Jul. 26, 2006) describes a top emitting structure, and U.S. Pat. No. 9,583,727 (Cho et al., issued Feb. 28, 2017) and U.S. Pat. No. 8,471,268 (Moon et al., issued Jun. 25, 2013) describe an OLED and QLED structure, with light emitting regions between reflective areas, one of which is partially transmitting.

Examples of methods for improving the luminance of such cavities are described in the following. US 2015/0084012 (Kim et al., published Mar. 26, 2015) describes the use of dispersive layers in an OLED structure, U.S. Pat. No. 8,894,243 (Cho et al., issued Nov. 25, 2014) describes the use of microstructure scattering for improving efficiency, and WO2017/205174 (Freier et al., published Nov. 30, 2017) and U.S. Pat. No. 8,581,230 (Kim et al., issued Nov. 12, 2013) describe enhancement of the emission by use of surface plasmon nanoparticles or nanostructures in the transport layers. US 2014/0014896 (Chung et al., published Nov. 16, 2014) describes a QLED structure with a thick ETL layer, which is related to charge injection but does not specify generally an ideal thickness for overall enhanced performance and optical efficiency. US 2015/0340410 (Hack et al., published Jan. 26, 2015) and US 2017/0207281 (Hack et al., published Jul. 20, 2017) describe OLED color pixels purportedly with different optical path lengths, although there is no description about how this exactly would be achieved.

For many applications, typical QD emissive layers include cadmium selenide (CdSe) (or similar materials that include cadmium), as the properties of this material are such that the device design using such an emissive layer is similar to an OLED based structure. CdSe, however, contains cadmium, which can be extremely harmful to health and the environment, and therefore materials such as indium phosphide (InP) have been developed for use as an alternative material for the emissive layer which do not contain cadmium. Although non-toxic, these InP based materials have significantly higher absorption and refractive index as compared to CdSe, and this changes the nature and performance of the optical cavity. In particular, there is a substantially higher degree of reflection at the boundaries of the emissive layer and the CTLs. Accordingly, conventional configurations of top emitting QLEDs have not yielded comparable performance and optical efficiency when the emissive material is a material of high refractive index, such as a InP based material or comparable material.

SUMMARY OF INVENTION

This present invention relates to specific designs for a light-emitting device used in an emissive display involving a quantum dot electro-emissive layer in an LED arrangement. This arrangement typically includes an emissive layer of quantum dot (QD) emission material sandwiched between an electron transport layer (ETL) and a hole transport layer (HTL). This stack is then sandwiched between two conductive electrode layers, one side of which is grown on a glass substrate. The present invention more particularly pertains to "top emitting" device structures. In a top emitting light-emitting device, the light emission is from the side opposite from the glass substrate layer.

In exemplary embodiments, the material for the emissive layer includes a cadmium-free material, with a relatively high refractive index, such as InP or comparable, rather than conventional toxic materials such as CdSe. As referenced above, there is a substantially higher degree of reflection at a boundary of an InP type emissive layer and the charge transport layers (CTLs), with the Fresnel refraction value exceeding 5% or more. Because of this higher reflection, the space between the two electrodes effectively is split into two "micro-cavities". The sizes of each of these micro-cavities separately then determine the extraction efficiency and the angular distribution of light emitted from the device. Thus, the cavity effects are less determined by the distance between the electrodes, as would be the case for cavities in conventional OLED and QLED configurations, but rather by the thicknesses of the ETL and HTL layers separately. For materials in which the Fresnel refraction value exceeds 5% at the emissive layer/CTL boundaries, embodiments of the present invention maximize extraction efficiency by configuring at least one of the CTLs to have a thickness of approximately ½ the peak emission wavelength in the CTL material (or whole multiples of this). With using a CTL that satisfies this half wavelength condition, as the angular distribution of light emission is almost independent of wavelength, an RGB device can be constructed in which the CTL layer thickness alone varies between the color pixels to make a high efficiency display with a small color shift at a suitable angle range.

An aspect of the invention, therefore, is a light-emitting device having an enhanced layer configuration for maximizing optical efficiency, particularly when the emissive layer is high refractive index material. In exemplary embodiments, the light emitting device includes an emissive layer; a first electrode and a second electrode from which charges are generated; a first charge transport layer that injects charges from the first electrode into the emissive layer; and a second charge transport layer that injects charges from the second electrode into the emissive layer. A Fresnel reflection value at boundaries between the emissive layer and at least one of the first and second charge transport layers is from 5% through 30%, and at least one of the charge transport layers satisfies a half wavelength condition of having a thickness that is equal to within twenty percent of ½ of one wavelength of an integer multiple of ½ of one wavelength in the charge transport layer material within a bandwidth of emission of the emissive layer. In exemplary embodiments, the one wavelength is a peak emission wavelength of the emissive layer, and/or the emissive layer includes an InP material, which does not contain cadmium. In other exemplary embodiments, at least one of the charge transport layers satisfies a half wavelength condition of having a thickness that is equal to within ten percent of ½ of one wavelength of an integer multiple of ½ of one wavelength in the charge transport layer material within a bandwidth of emission of the emissive layer.

In a preferred embodiment, the CTL having said thickness of approximately ½ the peak emission wavelength is on the emitting side of the emissive layer, and said CTL may be either the ETL or the HTL, and preferably is the ETL. In practice, a thicker HTL may improve efficiency for smaller emission wavelengths. In addition, the CTL having said thickness of approximately ½ the peak emission wavelength may be on the non-emitting side of the emissive layer, but such configuration may not have as great an extraction efficiency as when the thicker CTL is on the emitting side of the emissive layer.

Another aspect of the invention is a display device having a plurality of light-emitting devices according to any of the embodiments, wherein a portion of the light-emitting devices have different bandwidths of light emission. For example, the plurality of light-emitting devices may have an RGB configuration that includes a red light-emitting device, a green light-emitting device, and a blue light-emitting device. Charge transport layers that satisfy the half wavelength condition in light-emitting devices that have different bandwidths of light emission have different thicknesses to satisfy the half wavelength condition. The plurality of light-emitting devices otherwise may have first electrodes that are compositionally the same, second electrodes that are compositionally the same, and/or charge transport layers that do not satisfy the half wavelength condition that are compositionally the same.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 8 is a drawing depicting another exemplary light-emitting device in accordance with embodiments of the present invention.

DESCRIPTION OF EMBODIMENTS

Figure 1:
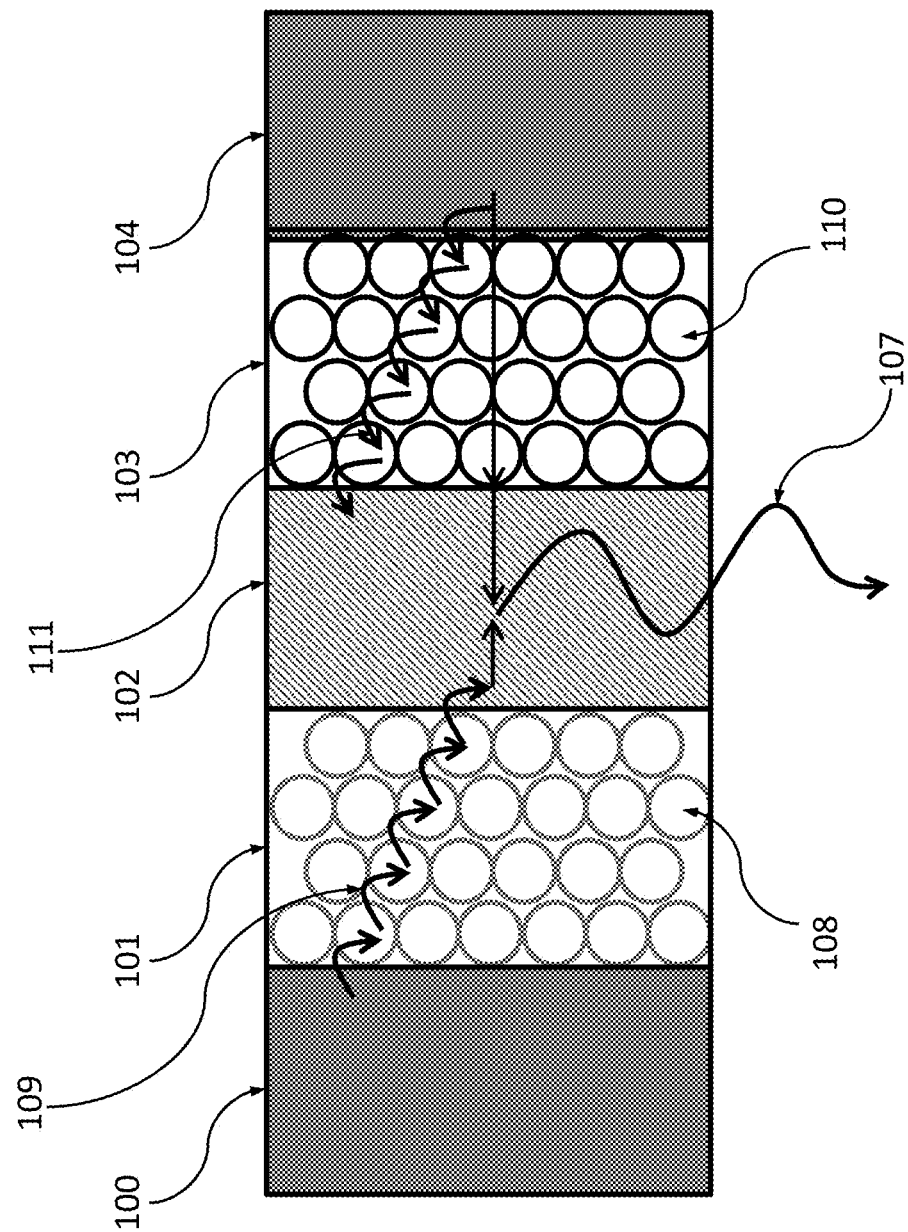
FIG. 1 is a drawing depicting an exemplary representation of a conventional light-emitting device.

Embodiments of the present invention will now be described with reference to the drawings, wherein like reference numerals are used to refer to like elements throughout. It will be understood that the figures are not necessarily to scale.

Figure 2:
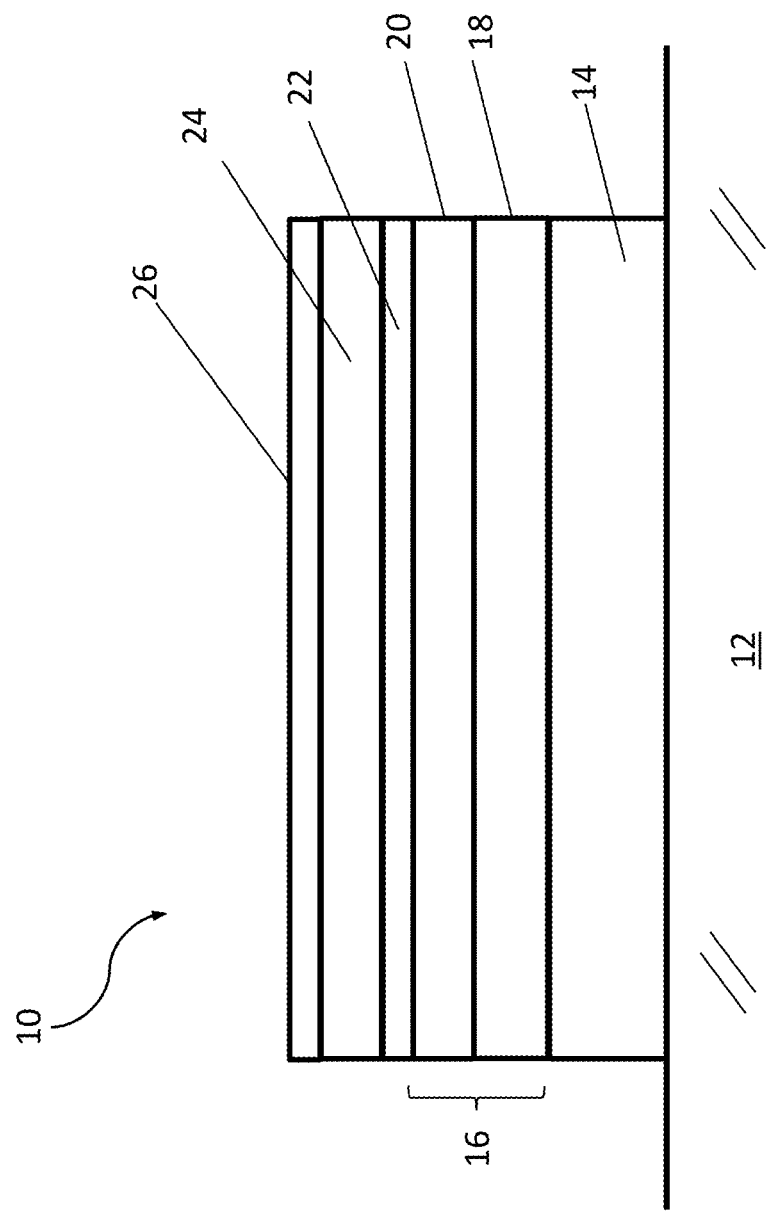
FIG. 2 is a drawing depicting a conventional top emitting light-emitting device.

FIG. 2 is a drawing depicting a conventional top emitting light-emitting device 10. As referenced above, "top emitting" refers to the emission through the top electrode rather than through the glass substrate. Accordingly, a glass substrate 12 is positioned a non-emitting side of the device, on which there is deposited a relatively thick (>80 nm) metal reflector layer 14 which is also used as a first electrode 14. The reflector/electrode 14 is typically made of aluminium or a silver/ITO layer. On the first electrode 14 is deposited a first charge transport layer (CTL) 16, which typically is the hole transport layer (HTL). The HTL typically includes two sub-layers, including a first or lower sub-layer 18 closer to the thicker electrode 14, and a second or upper sub-layer 20 farther from the thicker electrode 14. A quantum dot emissive layer 22 is next deposited on the HTL 16, and a second CTL 24 is deposited on the emissive layer 22. When the first CTL is the HTL, the second CTL 24 is the ETL, although the positions of the HTL and ETL may be reversed. The top layer, i.e., the emitting side layer, is a second reflector/electrode layer 26. The second electrode layer 26 typically is a relatively thin metal layer relative as compared to the thicker first electrode 14, and is partially transmissive for light emission, typically being made of silver or a magnesium-silver alloy.

For optimal fabrication of a top emitting device, the first electrode layer 14 is a relatively thick metal electrode layer, such as for example silver or aluminium, deposited on the glass substrate 12 with the HTL layer 16 deposited on the emitting side of the thick metal reflector layer. The ETL side second electrode layer 26 is then a relatively thin metal layer as compared to the HTL side electrode layer 14, with the ETL side electrode layer simply being configured sufficiently thick to carry sufficient current, but thin enough to be transparent to the light for emission. A typical ETL layer material for the ETL layer 24 is zinc oxide (ZnO) nanoparticles, and a typical HTL layer 16 includes a first sub-layer 18 of PEDOT:PSS (poly(3,4-ethylenedioxythiophene) polystyrene sulfonate) deposited on the first electrode layer 14, and a second sub-layer 20 of TFB [poly(9,9'-dioctylfluorene-co-bis-N,N'-(4-butylphenyl)diphenylamine)], deposited between the PEDOT:PSS sub-layer 18 and emissive layer 22. As referenced above, the principals of the present invention comparably are applicable to configurations in which the positions of the ETL and HTL layers are reversed.

Because in such conventional configuration the emitting side thin electrode 26 is partially reflecting, an optical cavity exists between the two electrode layers 14 and 26. Optimization of this optical cavity is standard practice for OLED based emissive displays. For a QD layer as an emissive layer, however, the optical properties may be significantly different from an OLED structure, and thus the layer properties to optimize the optical cavity would need to be different for a QD emissive layer. To alleviate this effort, as referenced above conventional QD emissive layers have been developed based on using cadmium selenide (CdSe), as the properties of this material are such that the device design using such an emissive layer is similar to an OLED based structure.

CdSe, however, contains cadmium, which can be extremely harmful to health and the environment, and therefore emissive materials such as indium phosphide (InP) have been developed for use as an alternative material for the emissive layer which do not contain cadmium. Although cadmium-free, these materials have significantly higher absorption and refractive index as compared to CdSe, and this changes the nature and performance of the optical cavity. In particular, there is a substantially higher degree of reflection at a boundary of the emissive layer and the CTLs. Accordingly, conventional configurations of top emitting QLEDs have not yielded comparable performance and optical efficiency when the emissive material includes a cadmium-free InP material or comparable due to the higher level of reflection at the emissive layer/CTL boundaries.

As used herein, the term "InP QD" generally refers to an emissive layer that includes an InP material in said emissive layer, and encompasses any suitable composition of an InP-based QD emissive layer. Such InP QDs include, for example, QDs comprising an InP material or an InP-based core located within one or more shell layers, such as for example a zinc sulphide (ZnS) shell around an InP core. There may be grading between the core and shell materials at the interfaces. The QD layer may comprise atomic or molecular ligands bound to the QDs, or other atoms or molecules in the space between the QDs. Any shell, ligands, or other atom or molecule may have the effect of reducing the overall refractive index of the layer below the value for bulk InP. The InP materials further may include InP doped with another element, such as for example gallium.

As referenced above, InP QD emissive layers have significantly higher absorption and refractive index as compared to CdSe emissive layers, and this changes the nature and performance of the optical cavity. In particular, there is a substantially higher degree of reflection at a boundary of the emissive layer and the CTLs. For example, at 630 nm of peak emission wavelength, the refractive index of TFB and ZnO is 1.745 and 1.7 respectively. The real refractive index of CdSe is 1.97, whereas for InP the real refractive index is 3.539. The Fresnel refraction value at the boundary between the ZnO/TFB and CdSe layers is about 0.5%, whereas the Fresnel refraction value for ZnO/TFB to InP is about 12.3%.

Figure 3:
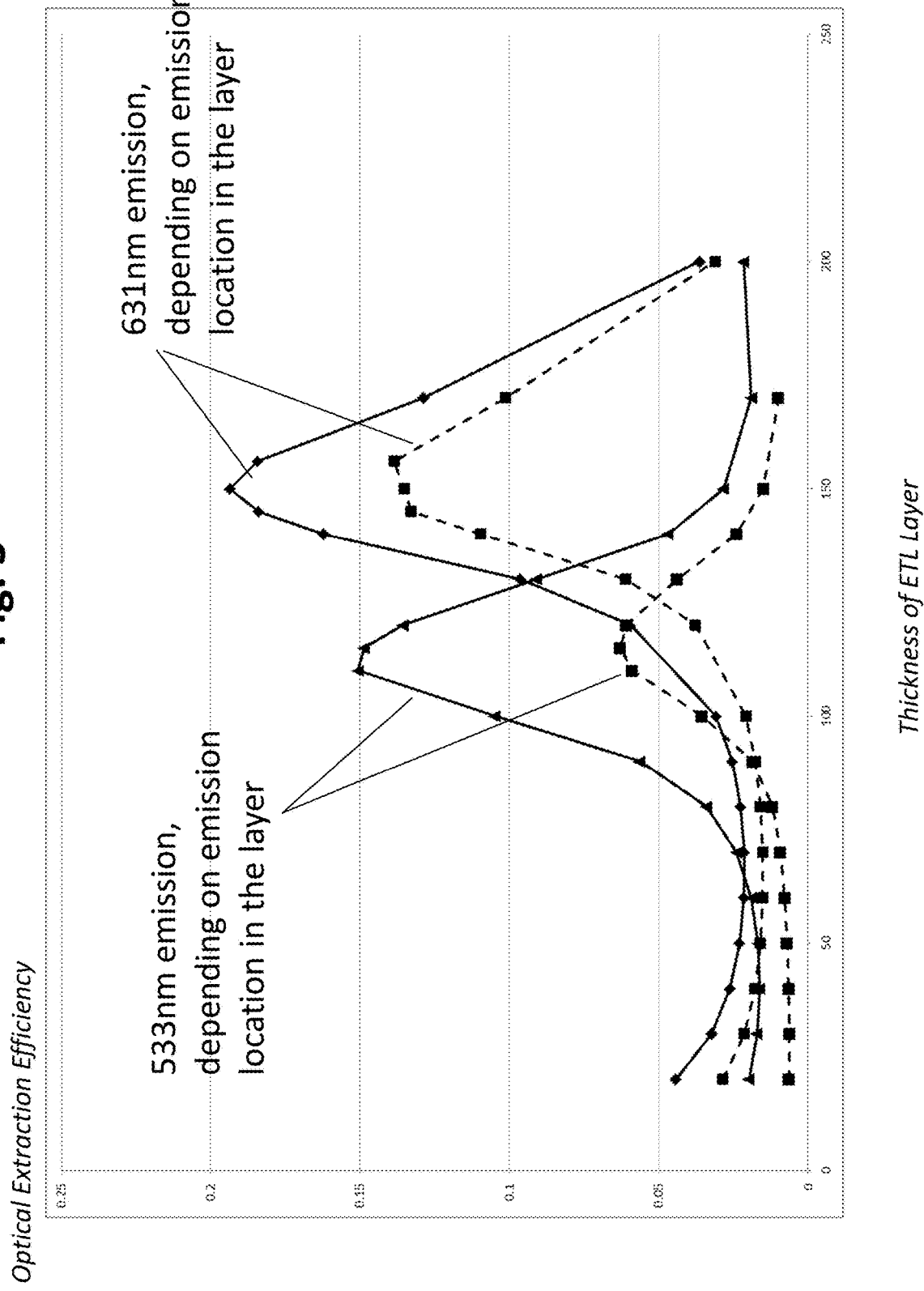
FIG. 3 is a graphical drawing depicting optical extraction efficiency for an emissive layer that includes an InP material.

In this regard, FIG. 3 is a graphical drawing depicting optical extraction efficiency for an emissive layer made of InP. FIG. 3 illustrates the optical extraction efficiency at two different peak emission wavelengths (533 nm emission and 631 nm emission, referring to the wavelength for propagation in air), and for light emitted on the HTL side (solid lines) and for light emitted on the ETL side (dashed lines). For such parameters, optical efficiency is plotted as a function of the thickness of the ETL layer. When a voltage is applied between the electrodes 14 and 26, electroluminescence in the emissive layer creates light emission that can escape the structure. The probability that a photon, once created, can escape the structure into the far field is called the extraction efficiency. In the case of InP quantum dots as the emissive layer, the refractive index is significantly higher than that of the surrounding CTL materials. In FIG. 3, a graph of the extraction efficiency for a 20 nm emissive layer, a 32 nm TFB HTL sub-layer, and 40 nm PEDOT:PSS HTL sub-layer is shown as a function of the ETL layer thickness for the referenced two different emission wavelengths. The range of possible efficiencies depending on the location of the photon emission in the emissive layer is also shown in the graph.

FIG. 3 illustrates that that there is a peak in extraction efficiency at a value of the ETL layer thickness approximately equivalent to half a wavelength of the emission in the ETL material from the emission layer. Because of the higher reflection experienced for an InP QD emissive layer, the space between the two electrodes effectively is split into two "micro-cavities". The sizes of each of these micro-cavities separately then determine the extraction efficiency and the angular distribution of light emitted from the device. Thus, the cavity effects are less determined by the distance between the opposing electrodes, as would be the case for cavities in conventional OLED and QLED configurations, but rather by the thicknesses of the ETL and HTL layers separately. Based on the results of optical efficiency illustrated in FIG. 3, embodiments of the present invention maximize extraction efficiency by configuring at least one of the CTLs to have a thickness of approximately ½ the peak emission wavelength in the CTL material (or whole multiples of this). In practice, comparable results are achieved so long as the thickness is within about twenty percent, and exemplary embodiments within ten percent, of ½ of one applicable wavelength of an integer multiple of ½ of one wavelength. As the angular distribution of light emission at this peak wavelength is almost independent of the wavelength, an RGB device can be constructed where the CTL layer thickness alone varies between the color pixels to make a high efficiency display with a small colour shift at angle.

An aspect of the invention, therefore, is a light-emitting device having an enhanced layer configuration for maximizing optical efficiency, particularly when the emissive layer is high refractive index material. In exemplary embodiments, the light emitting device includes an emissive layer; a first electrode and a second electrode from which charges are generated; a first charge transport layer that injects charges from the first electrode into the emissive layer; and a second charge transport layer that injects charges from the second electrode into the emissive layer. A Fresnel reflection value at boundaries between the emissive layer and at least one of the first and second charge transport layers is from 5% through 30%, and at least one of the charge transport layers satisfies a half wavelength condition of having a thickness that is equal to within twenty percent, and exemplary embodiments within ten percent, of ½ of one wavelength of an integer multiple of ½ of one wavelength in the charge transport layer material within a bandwidth of emission of the emissive layer. In exemplary embodiments, the one wavelength is a peak emission wavelength of the emissive layer, and/or the emissive layer includes an InP material, which does not contain cadmium.

As described in more detail below, in a preferred embodiment the CTL having said thickness of approximately ½ the peak emission wavelength (or an integer multiple within ten to twenty percent) is on the emitting side of the emissive layer, and said CTL may be either the ETL or the HTL, and preferably is the ETL. In practice, a thicker HTL may improve efficiency for smaller emission wavelengths. In addition, the CTL having said thickness of approximately ½ the peak emission wavelength may be on the non-emitting side of the emissive layer, but such configuration may not have as great an extraction efficiency as when the thicker CTL is on the emitting side of the emissive layer.

Figure 4:
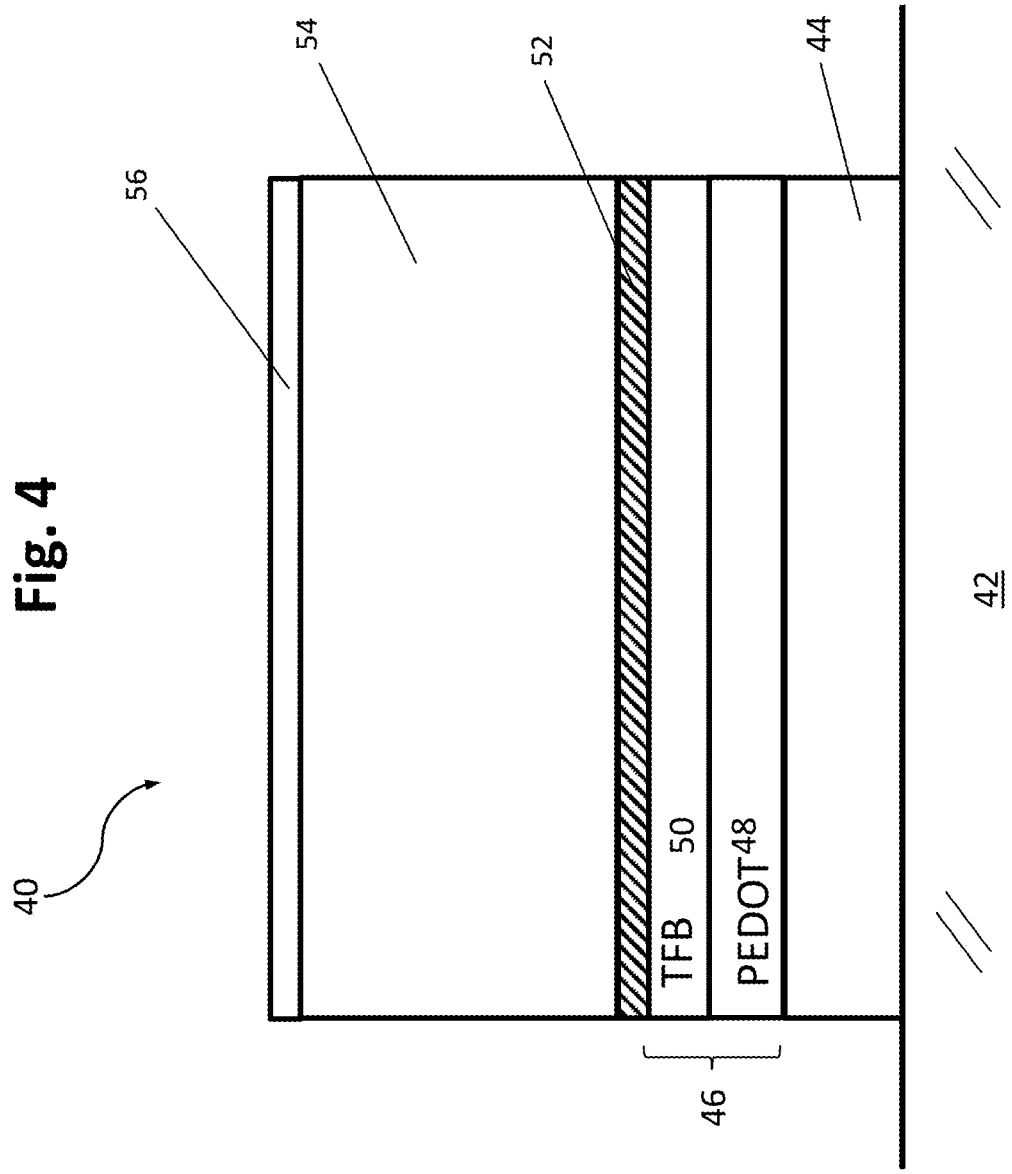
FIG. 4 is a drawing depicting an exemplary light-emitting device in accordance with embodiments of the present invention.

In accordance with such features, FIG. 4 is a drawing depicting an exemplary light-emitting device 40 in accordance with embodiments of the present invention. In overall structure, the light-emitting device 40 bears some overall similarity of configuration to the light-emitting device 10 of FIG. 2. The light-emitting device 40 is configured as a top emitting device having a glass substrate 42. On the glass substrate 42, there is deposited a relatively thick (>80 nm) metal reflector layer 44 which is also used as a first electrode 44. The first reflector/electrode 44 is typically made of aluminium or a silver/ITO layer. On the first electrode 44 is deposited a first charge transport layer (CTL) 46, which typically is the hole transport layer (HTL). The HTL 46 includes two sub-layers, including a first or lower PEDOT: PSS sub-layer 48 closer to the thicker electrode 44, and a second or upper TFB sub-layer 50 farther from the thicker electrode 44. A quantum dot emissive layer 52 is next deposited on the HTL 46, and a second CTL 54 is deposited on the emissive layer 52. When the first CTL 46 is the HTL, the second CTL 54 is the ETL, although the positions of the HTL and ETL may be reversed. The top layer, i.e., the emitting side layer, is a second reflector/electrode layer 56. The second electrode layer 26 typically is a thinner metal layer relative to the thicker first electrode 44 and is partially transmissive for light emission, and typically is made of silver or a magnesium-silver alloy.

In embodiments of the present invention, the emissive layer has a significantly higher refractive index than the neighboring CTL (HTL and ETL) layers, such that the Fresnel reflection value at the emissive layer/CTL interfaces exceeds 5%. As understood by those of ordinary skill in the art, the Fresnel refraction value equals $((N1-N2)/(N1+N2))^2$ (expressed as a percentage), wherein N1 and N2 are the respective refractive indices of the two materials of the neighboring layers (which may be complex, in which case the formula is $((N1-N2)/(N1+N2))((N1-N2)/(N1+N2))^*$, where "*" refers to the complex conjugate of the expression). In embodiments of the present invention, the material of the emissive layer is selected such that the Fresnel reflection value exceeds 5% and may be as high as 20-30%, at which the degree of reflection at the boundary of the pertinent layers tends to undermine the efficiencies of the light emission.

The emissive layer 52 may be an InP QD emissive layer that includes at least in part an InP material, and which does not contain cadmium. As referenced above, InP QD emissive layers have significantly higher refractive index as compared to conventional CdSe emissive layers, and thus there is a substantially higher degree of reflection at a boundary of the emissive layer and the CTLs. For example, at 630 nm of peak emission wavelength, the refractive index of TFB of the HTL layer is 1.745, and the refractive index of ZnO of the ETL layer is 1.7, while the real refractive index of InP is 3.539. The Fresnel refraction value refraction value for the CTLs to InP is thus about 12.3%. To maximize optical efficiency with such higher degree of reflection at the layer boundaries, the second or emitting side CTL 54, which in this example is the ETL, has a thickness that is equal to approximately ½ of one wavelength in the ETL material within the bandwidth of emission of the emissive layer 52, and preferably at the peak emission wavelength of the emissive layer 52. In this context, the half wavelength conditional generally is satisfied if the thickness is within twenty percent of said one wavelength in the ETL material within the bandwidth of emission of the emissive layer (and preferably the one wavelength is the peak emission wavelength of the emissive layer).

Figure 5:
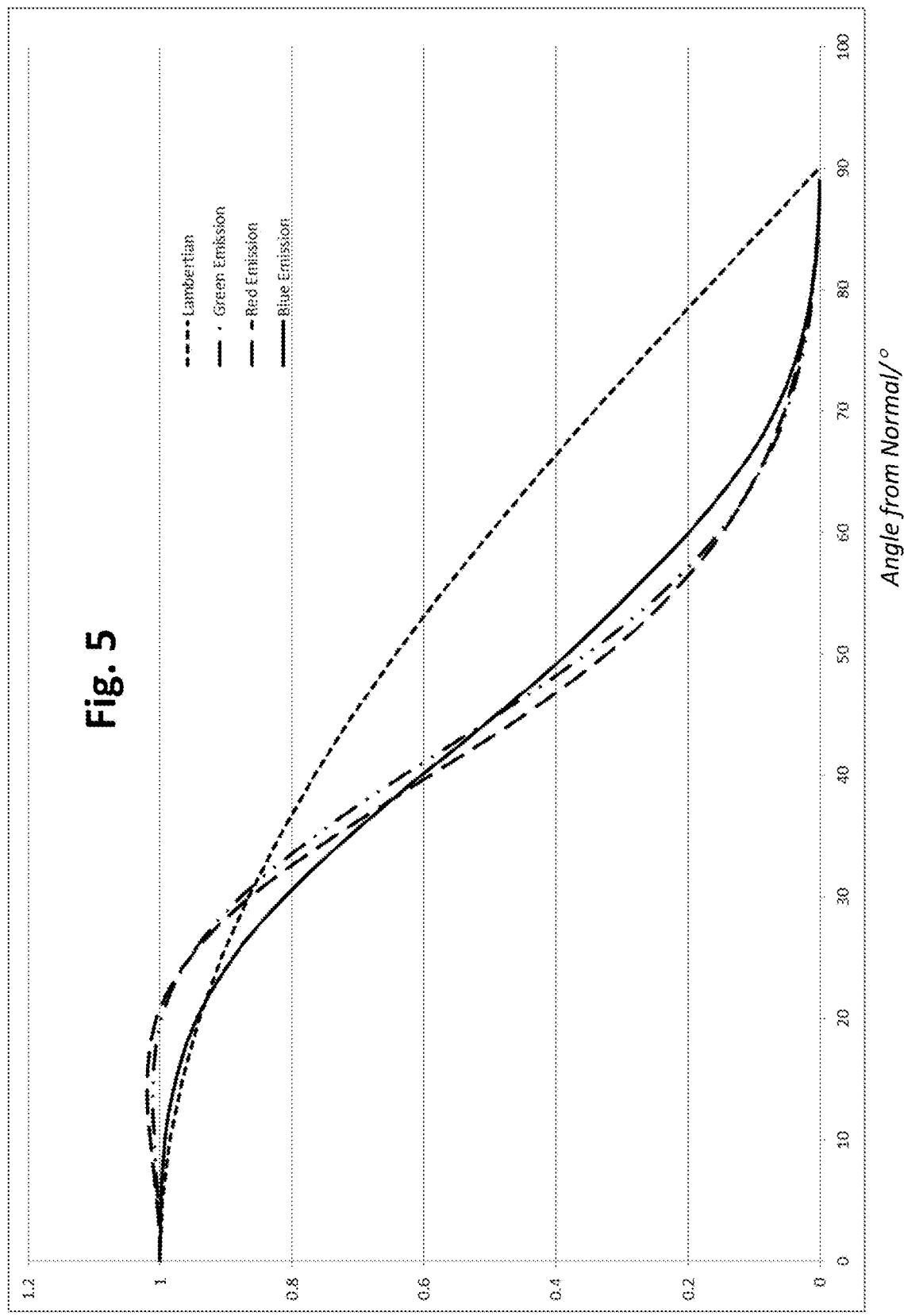
FIG. 5 is a graphical drawing depicting an angular emission of an exemplary light-emitting device as described with respect to the light-emitting device of FIG. 4.

FIG. 5 is a graphical drawing depicting an angular emission of exemplary light-emitting devices as described with respect to the light-emitting device of FIG. 4. FIG. 5 in particular depicts a plot of the angular emission for three such devices of different wavelength (color) emission as compared to a Lambertian emitter. The plot shows three plots, one each corresponding to an InP QD for a red and green emissive layer, and a blue InP QD emissive layer of equivalent refractive index. The devices are all designed so that the ETL is configured to have a thickness equal to the ½ peak wavelength of emission for the respective peak wavelengths of the different emissive layers (red, green, and blue). Otherwise, the structural parameters essentially are the same for the different color devices. In these examples, the angular distribution of the light-emitting devices for the different color is similar to each other, and narrower than for Lambertian emission. Essentially, for typical viewing angles of a display device up to about 20° off center axis viewing, brightness remains consistently high regardless of emission wavelength, provided the ETL layer meets the condition of having a thickness that is equal to approximately (i.e., within ten to twenty percent of ½ of one wavelength (or an integer multiple) of the peak emission wavelength of the emissive layer (and again, preferably the one wavelength is the peak emission wavelength of the emissive layer).

Using this observation, an RGB pixel array can be constructed for a display device in which essentially the only difference among the light-emitting devices for pixels of different emissive wavelengths (i.e., colors) is adjustment of the thicknesses of the respective CTLs to satisfy the half wavelength condition. Other components structurally essentially may be the same across the array of pixels. Another aspect of the invention, therefore, is a display device having a plurality of light-emitting devices according to any of the embodiments, wherein a portion of the light-emitting devices have different bandwidths of light emission. For example, the plurality of light-emitting devices may have an RGB configuration that includes a red light-emitting device, a green light-emitting device, and a blue light-emitting device. Charge transport layers that satisfy the half wavelength condition in light-emitting devices that have different bandwidths of light emission have different thicknesses to satisfy the half wavelength condition. The plurality of light-emitting devices otherwise may have first electrodes that are compositionally the same, second electrodes that are compositionally the same, and/or charge transport layers that do not satisfy the half wavelength condition that are compositionally the same.

Figure 6:
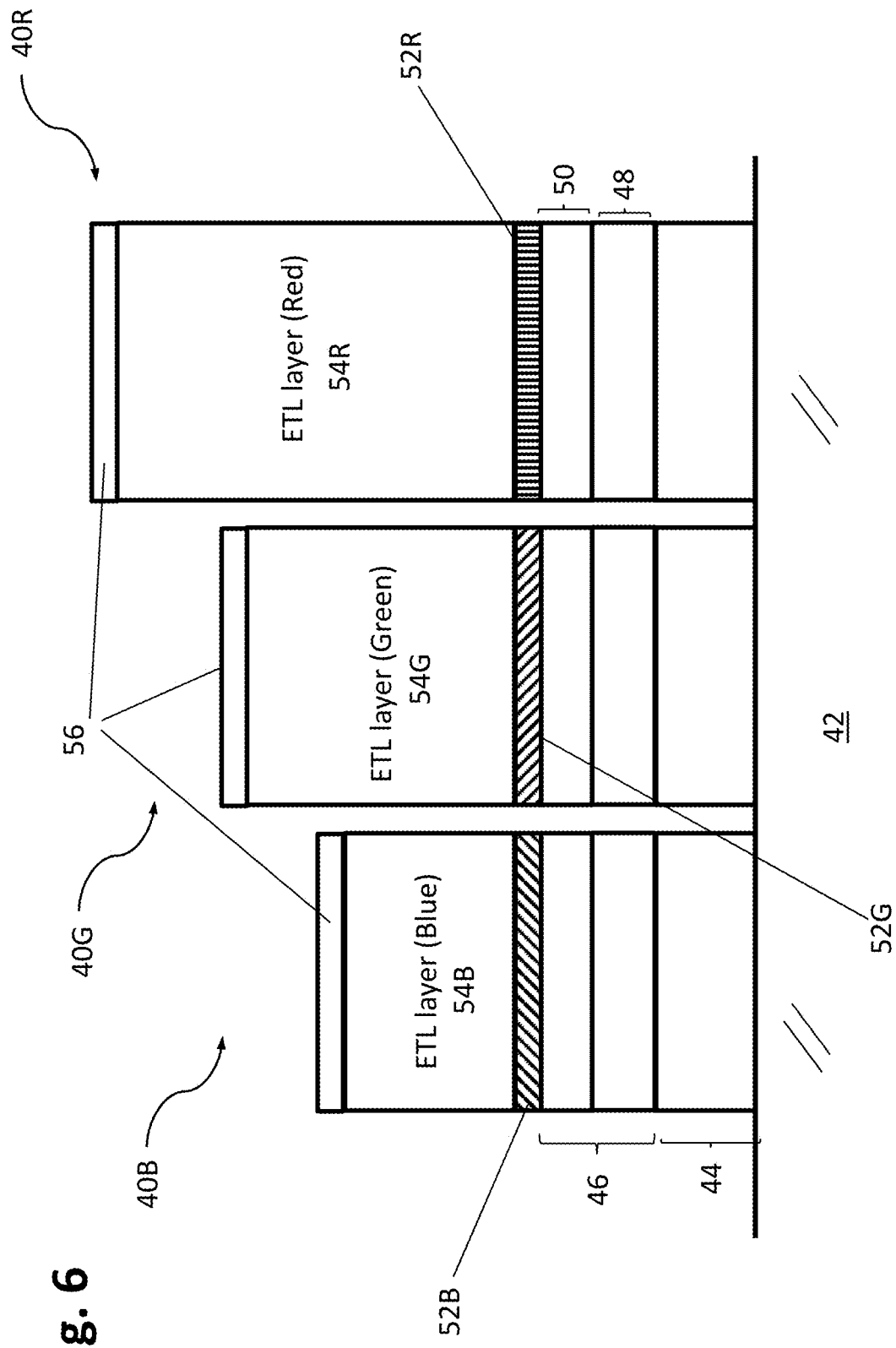
FIG. 6 is a drawing depicting an exemplary display device including red (R), green (G), and blue (B) light-emitting devices in accordance with embodiments of the present invention.

In accordance with such features, FIG. 6 is a drawing depicting an exemplary display device including red (R), green (G), and blue (B) light-emitting devices in accordance with embodiments of the present invention. Multiple RGB light-emitting devices may be configured into an array of pixels to form a broader QLED based display device. Each of the red light-emitting device 40R, the green light-emitting device 40G, and the blue light-emitting device 40B, is configured comparably as described above with respect to FIG. 4, and thus like reference numerals are used to identify like components in the various figures. Generally, the emissive layers are made of a cadmium-free, high refractive index material such as an InP based material as described above. In other words, the emissive layers for the color light-emitting devices 40R, 40G, and 40B may be InP QD emissive layers that include an InP material. The respective emissive layers for the different color emission bandwidths are denoted 52R for the red light-emitting device 40R, 52G for the green light-emitting device 40G, and 52B for the blue light-emitting device 40B. For example, a red versus green light-emitting device may be made using different InP based materials for the emissive layers (e.g. with doping of InP with one or more other elements), or by using QDs of a different size of a comparable InP based material. A blue light-emitting device can use InP QDs with small size, for example, but may also be generated by doping an InP material with another element to obtain blue emitting particle sizes. A suitable doping element is gallium, whereby the blue emissive layer includes an $In_xGa_{1-x}P$ type material.

The principal difference among the RGB light-emitting devices is the respective thickness of the ETL to meet the half wavelength condition depending upon the peak emission wavelength (and/or the associated wavelength bandwidth) of the emissive layers. The other layers and components essentially are the same among the different color light-emitting devices. As illustrated in FIG. 6, therefore, to meet the half wavelength condition, the ETL 54R for the red light-emitting device 40R is the thickest ETL as red light has the longest wavelength, the ETL 54G for the green light-emitting device 40G is the next thickest ETL as green light has the next longest wavelength, and the ETL 54B for the blue light-emitting device 40B is the least thick ETL as blue light has the shortest wavelength. The differing thicknesses can be achieved by having a step approach with masks, adding a different layer thickness each time, or also can be achieved using an inkjet approach. For simplicity, the pixel driving electronics are not shown and the width is compressed to show the three pixels separately side by side, but any suitable conventional pixel array arrangement and drive electronics may be employed.

In the previous embodiments, the CTL having a thickness of approximately ½ the peak emission wavelength is an ETL on the emitting side of the emissive layer. Said CTL alternatively may be the HTL. As another variation, the CTL having said thickness of approximately ½ the peak emission wavelength may be on the non-emitting side of the emissive layer, but such configuration may not have as great an extraction efficiency as when the thicker CTL is on the emitting side of the emissive layer.

Figure 7:
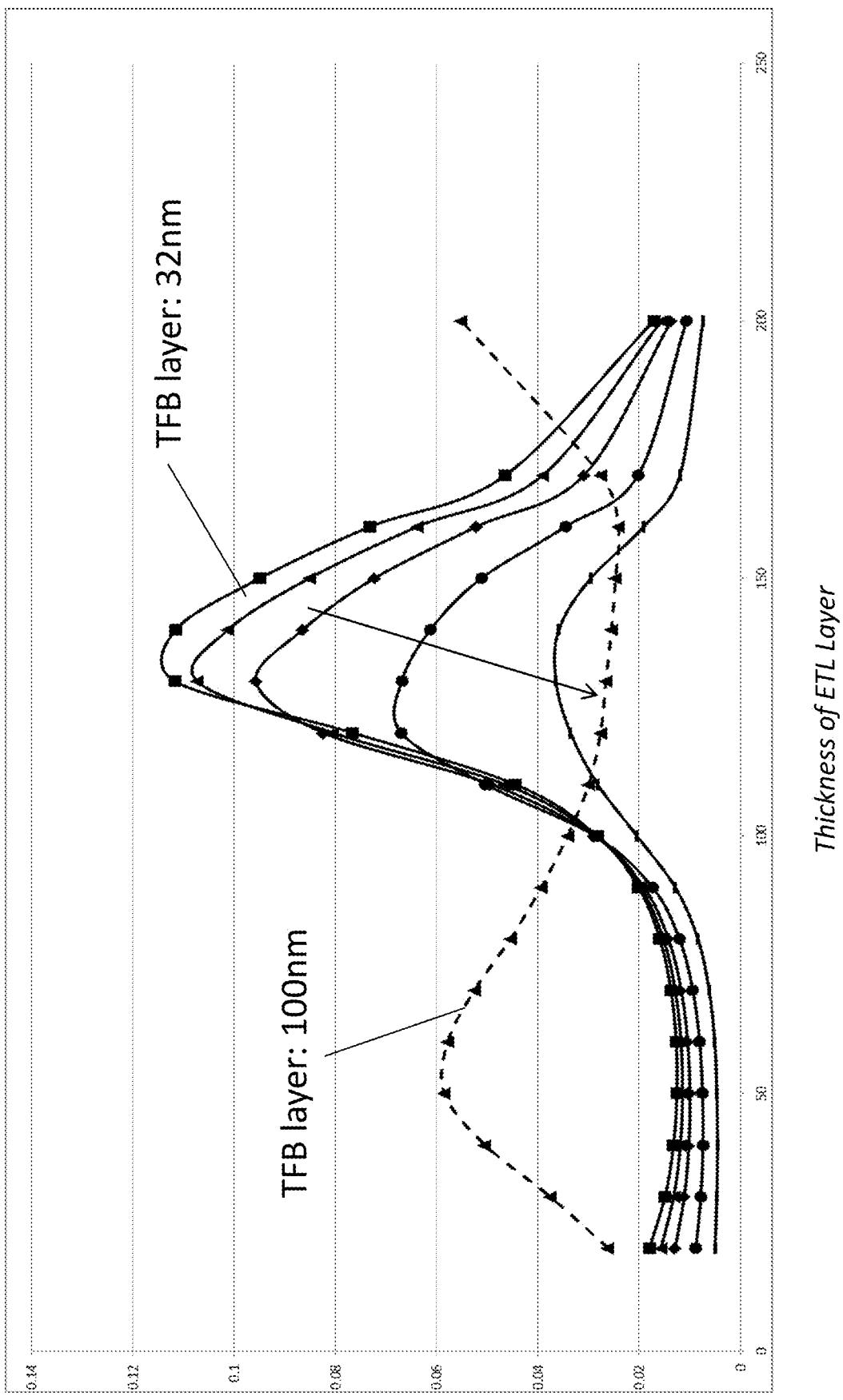
FIG. 7 is a graphical drawing depicting optical extraction efficiency for an emissive layer including an InP material, illustrating effects of a thicker HTL layer.

As illustrating the basis for an embodiment in which the thicker CTL is an HTL, FIG. 7 is a graphical drawing depicting optical extraction efficiency for an exemplary green emissive layer including an InP material. The graph of FIG. 7 shows a simulation for the green emitting InP layer where the TFB sub-layer in the HTL layer has a thickness in a range of 32 nm up to 100 nm, with each curve representing an increased thickness of the TFB sub-layer. Emission from only one side of the emissive layer (specifically the HTL side) is shown, although a comparable result is observed for emission from the opposite side. FIG. 7 illustrates that as the HTL layer thickness is increased, the efficiency at the peak emission wavelength drops until the efficiency rises again at a significantly smaller ETL layer thickness (around 60 nm). This phenomenon corresponds to the condition by which the HTL layer thickness approaches ½ peak emission wavelength in the HTL material. Though FIG. 7 illustrates this effect for a green light-emitting device, comparable results are observed for a red or blue device of comparable construction. FIG. 7 in particular illustrates an embodiment in which the positioning of the thick layer is interchanged from previous embodiments, i.e., the thick HTL is located between the emissive layer and the substrate on the non-emitting side of the emissive layer.

Accordingly, FIG. 8 is a drawing depicting another exemplary light-emitting device 60 in accordance with embodiments of the present invention. Generally, the embodiment of FIG. 8 is comparable to that of FIG. 4, except that the HTL is configured to satisfy the condition of having a thickness equal to approximately (i.e., within ten percent) ½ of one wavelength in the HTL material within the bandwidth of emission of the emissive layer, and preferably at the peak emission wavelength of the emissive layer. The emissive layer again is configured as a high refractive index layer such that the Fresnel refraction value exceeds 5% at the boundary of the HTL and emissive layer. In a preferred embodiment, the emissive layer includes a cadmium-free InP material such that the emissive layer is an InP QD emissive layer.

Referring to the specific example of FIG. 8, the light-emitting device 60 is configured as a top emitting device having a glass substrate 62. On the glass substrate 60, there is deposited a relatively thick (>80 nm) metal reflector layer 64 which is also used as a first electrode 64. The first reflector/electrode 64 is typically made of aluminium or a silver/ITO layer. On the first electrode 64 is deposited a first charge transport layer (CTL) 66, which in this example is the hole transport layer (HTL). The HTL 66 includes two sub-layers, including a first or lower PEDOT:PSS sub-layer 68 closer to the thicker electrode 64, and a second or upper TFB sub-layer 70 farther from the thicker electrode 64. A quantum dot emissive layer 72 with a high refractive index is next deposited on the HTL 66, and a second CTL 74, which in this example is the ETL, is deposited on the emissive layer 72. The top layer, i.e., the emitting side layer, is a second partially transmissive reflector/electrode layer 76. The second electrode layer 76 typically is a thinner metal layer relative to the thicker first electrode 64, and typically is made of silver or a magnesium-silver alloy.

As referenced above, in this example the HTL 66 is configured to satisfy the half wavelength condition, and this particularly may be achieved by increasing a thickness of the TFB second sub-layer 70 to be greater than a thickness of the PEDOT:PSS first sub-layer 68, such that the overall thickness of the HTL 66 satisfies said half wavelength condition of having a thickness equal to approximately ½ of one wavelength in the HTL material within the bandwidth of emission of the emissive layer (and preferably the peak emission wavelength of the emissive layer).

In the various exemplary embodiments, particular choices of materials for each layer may be made as is suitable for any particular application or configuration. For example, the following materials may be employed for the various layers, in which either or both of the HTL and ETL are comprised of a mixture of different nanoparticles. The electrodes may be either a highly conductive metal (such as but not limited to Al, Au, Ag, Mg:Ag alloy, or a Ca/Al bilayer) or a metal oxide (such as but not limited to Indium Tin Oxide (ITO), Fluorinated Tin Oxide (FTO), Tin Oxide ($SnO_2$), Indium Oxide ($In_2O_3$), indium zinc oxide (IZO) or Zinc Oxide (ZnO)). The HTL is an organic or inorganic homogeneous material or combination of homogenous materials, such as but not limited to poly(3,4-ethylenedioxythiophene):poly (styrenesulfonate) (PEDOT:PSS), poly(9,9-dioctylfluorene-co-N-(4-sec-butylphenyl)-diphenylamine) (TFB), poly(9-vinylcarbazole) (PVK), poly(N, N'-bis(4-butylphenyl)-N, N'-bisphenylbenzidine) (PolyTPD), 2,3,5,6-tetrafluoro-7,7, 8,8-tetracyanoquinodimethane (F4TCNQ), 1,4,5,8,9,11-hexaazatriphenylenehexacarbonitrile (HATCN). The HTL can alternatively be a mixture of different nanoparticles such as $V_2O_5$, $MoO_3$, NiO, CuO, $WO_3$. The ETL may include materials such as but not limited to 2,2',2"-(1,3,5-benzinetriyl)-tris(1-phenyl-1-H-benzimidazole) (TPBi), 8-quinolinolato lithium (Liq.), LiF, $Cs_2CO_3$. The ETL can alternatively be a mixture of different nanoparticles such as $Mg_xZn_{1-x}O$, $Al_xZn_{1-x}O$, $TiO_2$, $ZrO_2$, $Al_2O_3$, HfO, $CeO_2$, $Fe_2O_3$, $SnO_2$, $In_2O_3$ where $0 \leq x \leq 1$.

The emissive layer may be an emissive organic semiconductor with high refractive index depending on the materials of the transport layers surrounding it such as Alq3, or a layer of emissive inorganic nanoparticles such as InP, InN, $Zn_2N_3$, $In_xZn_yN_z$, ZnSe, perovskites of the form $ABX_3$, $Zn_wCu_z$ $In_{1-(w+z)}S$, carbon, where $0 \leq w$, x, y, $z \leq 1$ and (w+z) 1. Cadmium QDs of the form CdSe, CdS, $CdSe_xS_{1-x}$, CdTe, $Cd_xZn_{1-x}Se$, and $Cd_xZn_{1-x}Se_yS_{1-y}$ could be used if the properties of the surrounding transport layers is such as to exceed the 5% Fresnel reflection condition, although as described above, cadmium-free materials such as InP based materials may be used to avoid any potential effects of toxicity of cadmium based materials.

In exemplary embodiments, the first electrode and/or the second electrode have reflective properties, with the viewing side electrode typical being partially reflective and the non-viewing side electrode typically being fully reflective. In such case, reflection off of the electrode layers may introduce a pi-based phase shift, which can alter the ½ wavelength condition in the charge transport layer. For example, the light pathway may undergo a double bounce pass (reflection from reflecting electrode, reflection from emissive layer, and transmission through reflector, for example) which causes a phase shift of 2-pi in the emission. Typically, with such phase shift a thinner charge transport layer will be required to satisfy the ½ wavelength condition. In exemplary embodiments, therefore, the thickness of the pertinent charge transport layer satisfies the ½ wavelength condition incorporating any phase shift due to reflection off of one of the electrodes.

Embodiments of the present invention, therefore, maximize extraction efficiency of a high refractive index emissive layer by configuring at least one of the CTLs to have a thickness of approximately ½ the peak emission wavelength in the CTL material (or whole multiples of this), and preferably as to an ETL on the emitting side of the emissive layer. Such high refractive materials include cadmium-free materials such InP based materials, and thus the principles of the present invention result in maximized extraction efficiency without the deficiency of toxicity of conventional materials. It should be noted that while one of the CTL should be ½ wavelength, the other should be at the same time relatively thin or as thin as possible for best results.

An aspect of the invention, therefore, is a light-emitting device having an enhanced layer configuration for maximizing optical efficiency, particularly when the emissive layer is high refractive index material. In exemplary embodiments, the light emitting device includes an emissive layer; a first electrode and a second electrode from which charges are generated; a first charge transport layer that injects charges from the first electrode into the emissive layer; and a second charge transport layer that injects charges from the second electrode into the emissive layer. A Fresnel reflection value at boundaries between the emissive layer and at least one of the first and second charge transport layers is from 5% through 30%. At least one of the charge transport layers satisfies a half wavelength condition of having a thickness that is equal to within twenty percent of ½ of one wavelength of an integer multiple of ½ of one wavelength in the charge transport layer material within a bandwidth of emission of the emissive layer. The light-emitting device may include one or more of the following features, either individually or in combination.

In an exemplary embodiment of the light-emitting device, the one wavelength is a peak emission wavelength of the emissive layer.

In an exemplary embodiment of the light-emitting device, the light-emitting device is a top emitting device, and the at least one of the charge transport layers that satisfies the half wavelength condition includes a charge transport layer positioned on an emitting side of the emissive layer.

In an exemplary embodiment of the light-emitting device, the light-emitting device is a top emitting device, and the at least one of the charge transport layers that satisfies the half wavelength condition includes a charge transport layer positioned on a non-emitting side of the emissive layer.

In an exemplary embodiment of the light-emitting device, the at least one of the charge transport layers that satisfies the half wavelength condition includes an electron transport layer.

In an exemplary embodiment of the light-emitting device, the at least one of the charge transport layers that satisfies the half wavelength condition includes a hole electron transport layer.

In an exemplary embodiment of the light-emitting device, both the first and second charge transport layers satisfy the half wavelength condition.

In an exemplary embodiment of the light-emitting device, one of the charge transport layers is a hole transport layer comprising a first sub-layer deposited on the first electrode and a second sub-layer deposited between the first sub-layer and the emissive layer.

In an exemplary embodiment of the light-emitting device, the first sub-layer is made of PEDOT:PSS (poly(3,4-ethylenedioxythiophene) polystyrene sulfonate) and the second sub-layer is made of TFB [poly(9,9'-dioctylfluorene-co-bis-N,N-(4-butylphenyl)diphenylamine)].

In an exemplary embodiment of the light-emitting device, the at least one of the charge transport layers that satisfies the half wavelength condition includes the hole transport layer, and the second sub-layer has a thickness greater than the first sub-layer.

In an exemplary embodiment of the light-emitting device, the light-emitting device is a top emitting device and the second electrode is on an emitting side of the emissive layer, and the second electrode is partially transmissive.

In an exemplary embodiment of the light-emitting device, the first electrode is deposited on a substrate on a non-emitting side of the emissive layer.

In an exemplary embodiment of the light-emitting device, the emissive layer includes an indium phosphide (InP) material.

In an exemplary embodiment of the light-emitting device, the InP material includes an InP core located within one or more shell layers.

In an exemplary embodiment of the light-emitting device, the InP material includes InP doped with another element.

In an exemplary embodiment of the light-emitting device, the another element is gallium.

In an exemplary embodiment of the light-emitting device, at least one electrode of the first and second electrodes has reflective properties, and the at least one of the charge transport layers that satisfies the half wavelength condition satisfies the ½ wavelength condition incorporating any phase shift due to reflection off of the at least one electrode.

In an exemplary embodiment of the light-emitting device, the at least one of the charge transport layers satisfies a half wavelength condition of having a thickness that is equal to within ten percent of ½ of one wavelength of an integer multiple of ½ of one wavelength in the charge transport layer material within a bandwidth of emission of the emissive layer.

Another aspect of the invention is a display device having a plurality of light-emitting devices according to any of the embodiments, wherein a portion of the light-emitting devices have different bandwidths of light emission. The display device may include one or more of the following features, either individually or in combination.

In an exemplary embodiment of the display device, charge transport layers that satisfy the half wavelength condition in light-emitting devices that have different bandwidths of light emission have different thicknesses to satisfy the half wavelength condition.

In an exemplary embodiment of the display device, the plurality of light-emitting devices comprises: a red light-emitting device having a peak emission wavelength within a red bandwidth; a green light-emitting device having a peak emission wavelength within a green bandwidth; and a blue light-emitting device having a peak emission wavelength within a blue bandwidth.

In an exemplary embodiment of the display device, the plurality of light-emitting devices have first electrodes that are compositionally the same, second electrodes that are compositionally the same, and/or charge transport layers that do not satisfy the half wavelength condition that are compositionally the same.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to light-emitting devices that, for example, may be used for light-emitting elements in a display device, and QLED type display technology is a suitable example. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high resolution display is desirable.

REFERENCE SIGNS LIST

10—top emitting light-emitting device
12—glass substrate
14—metal reflector layer/first electrode
16—first charge transport layer (CTL)
18—first or lower sub-layer
20—second or upper sub-layer
22—quantum dot emissive layer
24—second charge transport layer (CTL)
26—second electrode layer
40—exemplary light-emitting device
40R—red light-emitting device
40G—green light-emitting device
40B—blue light-emitting device
42—glass substrate
44—metal reflector layer/first electrode
46—first charge transport layer (CTL)
48—first or lower sub-layer
50—second or upper sub-layer
52—quantum dot emissive layer
52R—red light-emitting device
52G—green light-emitting device
52B—blue light-emitting device
54—second charge transport layer (CTL)
54R—red light-emitting device
54G—green light-emitting device
54B—blue light-emitting device
56—second reflector/electrode layer
60—light-emitting device
62—glass substrate
64—metal reflector layer/first electrode 66—first charge transport layer (CTL)
68—first or lower sub-layer
70—second or upper sub-layer
72—quantum dot emissive layer
74—second charge transport layer (CTL)
76—second electrode layer
100—cathode
101—electron transport layer
102—light-emitting or emissive layer
103—hole transport layer
104—anode
107—light
108—nanoparticles
109—electron hopping
110—nanoparticles
111—hole hopping

What is claimed is:

1. A light-emitting device comprising:
   an emissive layer;
   a first electrode and a second electrode from which charges are generated;
   a first charge transport layer that injects charges from the first electrode into the emissive layer; and
   a second charge transport layer that injects charges from the second electrode into the emissive layer;
   wherein a Fresnel reflection value at boundaries between the emissive layer and at least one of the first and second charge transport layers is from 5% through 30%; and
   wherein at least one of the first and second charge transport layers satisfies a half wavelength condition of having a thickness that is equal to within twenty percent of ½ of one wavelength of an integer multiple of ½ of one wavelength in a charge transport layer material within a bandwidth of emission of the emissive layer.

2. The light-emitting device of claim 1, wherein the one wavelength is a peak emission wavelength of the emissive layer.

3. The light-emitting device of claim 1, wherein the light-emitting device is a top emitting device, and the at least one of the charge transport layers that satisfies the half wavelength condition includes a charge transport layer positioned on an emitting side of the emissive layer.

4. The light-emitting device of claim 1, wherein the light-emitting device is a top emitting device, and the at least one of the charge transport layers that satisfies the half wavelength condition includes a charge transport layer positioned on a non-emitting side of the emissive layer.

5. The light-emitting device of claim 1, wherein the at least one of the charge transport layers that satisfies the half wavelength condition includes an electron transport layer.

6. The light-emitting device of claim 1, wherein the at least one of the charge transport layers that satisfies the half wavelength condition includes a hole electron transport layer.

7. The light-emitting device of claim 1, wherein both the first and second charge transport layers satisfy the half wavelength condition.

8. The light-emitting device of claim 1, wherein one of the charge transport layers is a hole transport layer comprising a first sub-layer deposited on the first electrode and a second sub-layer deposited between the first sub-layer and the emissive layer.

9. The light-emitting device of claim 8, wherein the first sub-layer is made of PEDOT:PSS (poly(3,4-ethylenedioxythiophene) polystyrene sulfonate) and the second sub-layer is made of TFB [poly(9,9'-dioctylfluorene-co-bis-N, N'-(4-butylphenyl)diphenylamine)].

10. The light-emitting device of claim 8, wherein the at least one of the charge transport layers that satisfies the half wavelength condition includes the hole transport layer, and the second sub-layer has a thickness greater than the first sub-layer.

11. The light-emitting device of claim 1, wherein the light-emitting device is a top emitting device and the second electrode is on an emitting side of the emissive layer, and the second electrode is partially transmissive.

12. The light-emitting device of claim 11, wherein the first electrode is deposited on a substrate on a non-emitting side of the emissive layer.

13. The light-emitting device of claim 1, wherein the emissive layer includes an indium phosphide (InP) material.

14. The light-emitting device of claim 13, wherein the InP material includes an InP core located within one or more shell layers.

15. The light-emitting device of claim 1, wherein the at least one of the charge transport layers satisfies a half wavelength condition of having a thickness that is equal to within ten percent of ½ of one wavelength of an integer multiple of ½ of one wavelength in the charge transport layer material within a bandwidth of emission of the emissive layer.

16. The light-emitting device of claim 1, wherein at least one electrode of the first and second electrodes has reflective properties, and the at least one of the charge transport layers that satisfies the half wavelength condition satisfies the ½ wavelength condition incorporating any phase shift due to reflection off of the at least one electrode.

17. A display device comprising a plurality of light-emitting devices according to claim 1, wherein a portion of the light-emitting devices have different bandwidths of light emission.

18. The display device of claim 17, wherein charge transport layers that satisfy the half wavelength condition in light-emitting devices that have different bandwidths of light emission have different thicknesses to satisfy the half wavelength condition.

19. The display device of claim 17, wherein the plurality of light-emitting devices comprises:
   a red light-emitting device having a peak emission wavelength within a red bandwidth;
   a green light-emitting device having a peak emission wavelength within a green bandwidth; and
   a blue light-emitting device having a peak emission wavelength within a blue bandwidth.

20. The display device of claim 16, wherein the plurality of light-emitting devices have first electrodes that are compositionally the same, second electrodes that are compositionally the same, and/or charge transport layers that do not satisfy the half wavelength condition that are compositionally the same.

* * * * *